United States Patent [19]
Matsumoto

[11] Patent Number: 4,859,625
[45] Date of Patent: Aug. 22, 1989

[54] METHOD FOR EPITAXIAL GROWTH OF COMPOUND SEMICONDUCTOR USING MOCVD WITH MOLECULAR LAYER EPITAXY

[75] Inventor: Junichi Nishizawa, Miyagi-Ken Japan; Toru Kurabayashi, Miyagi-Ken Japan; Hitoshi Abe, Tokyo Japan; Fumio Matsumoto, Miyagi, Japan

[73] Assignee: Research Development Corporation of Japan, Junichi Nishizawa and Oki Electric Industry Co., Ltd., Japan

[21] Appl. No.: 123,497

[22] Filed: Nov. 20, 1987

[30] Foreign Application Priority Data

Nov. 22, 1986 [JP] Japan ................. 61-277829

[51] Int. Cl.$^4$ ............................. H01L 21/205
[52] U.S. Cl. ..................... 437/81; 148/DIG. 25; 148/DIG. 41; 148/DIG. 48; 148/DIG. 57; 148/DIG. 72; 148/DIG. 110; 148/DIG. 94; 156/613; 437/19; 437/111; 437/133; 437/173; 437/936; 437/942; 437/963; 427/53.1
[58] Field of Search ............ 148/DIG. 6, 21, 25, 148/41, 48, 56, 65, 71, 72, 94, 110, 160, 169, 57; 156/610-614; 427/53.1, 54.1; 437/19, 81, 107, 108, 110, 111, 133, 173, 936, 942, 949, 963

[56] References Cited

U.S. PATENT DOCUMENTS

| | | | |
|---|---|---|---|
| 3,626,257 | 12/1971 | Esaki | 357/3 |
| 3,867,202 | 2/1975 | Ichiki et al. | 437/107 |
| 3,979,235 | 9/1976 | Boucher | 437/84 |
| 4,058,430 | 11/1977 | Suntola et al. | 156/611 |
| 4,504,331 | 3/1985 | Kuech et al. | 437/81 |

FOREIGN PATENT DOCUMENTS

2162206  1/1986  United Kingdom ........... 156/611

OTHER PUBLICATIONS

Doi et al., "Stepwise Monolayer Growth of GaAs by Switched Laser Metalorganic Vapor Phase Epitaxy", Appl. Phys. Lett. 49(13), 29 Sep. 1986, pp. 785-787.
Doi et al., "Growth of GaAs by Switched Laser Metalorganic Vapor Phase Epitaxy", Appl. Phys. Lett. 48(26), 30 Jun. 1986, pp. 1787-1789.
Razeghi et al., "Monolayer Epitaxy of III-V Compounds...", Appl. Phys. Lett. 51(26), 28 Dec. 1987, pp. 2216-2218.
Balk et al., "Ultraviolet Induced Metal-Organic Chemical Vapor Deposition Growth of GaAs", J. Vac. Sci. Technol. A4(3), May/Jun. 1986, pp. 711-715.
Nishizawa et al., "Molecular Layer Epitaxy", J. Electrochem. Soc. May 1985, pp. 1197-1200.
Sakaki et al., "One Atomic Layer Heterointerface Fluctuations in GaAs—AlAs...", Jan. 5 Appl. Phys., vol. 24, No. 6, Jun. 1985, pp. L417-L420.
Pessa et al., "Atomic Layer Epitaxy... of cdte Films...", J. Appl. Phys. 54(10), Oct. 1983, pp. 6047-6050.
Usui et al., "GaAs Atomic Layer Epitaxy by Hydride VPE", Jpn. J. Appl. Phys., vol. 25, No. 3, Mar. 1986, pp. L212-L214.
Kobayashi et al., "Flow-Rate Modulation Epitaxy of GaAs", Inst. Phys. Conf. Ser. No. 79, Chapter 13, 1985, pp. 737-738.
Aoyagi et al., "Atomic-Layer Growth of GaAs by Modulated...", J. Vac. Sci. Technol. B5(5), Sep./Oct. 1987, pp. 1460-1464.
Bedair et al., Appl. Phys. Lett. 48(2), 13 Jan. 1986, pp. 174-176.
Nishizawa et al., "Photostimulated Molecular Layer Epitaxy", J. Vac. Sci. Technol. A4(3), May/Jun. 1986, pp. 706-710.

*Primary Examiner*—Brian E. Hearn
*Assistant Examiner*—William Bunch
*Attorney, Agent, or Firm*—Darby & Darby

[57] ABSTRACT

A method for epitaxial growth of compound semiconductor containing three component elements, two component elements thereof being the same group elements, in which three kinds of compound gases each containing different one of the three component elements are cyclically introuded, under a predetermined pressure for a predetermined period respectively, onto a substrate enclosed in an evacuated crystal growth vessel so that a single crystal thin film of the compound semiconductor is formed on the substrate.

22 Claims, 18 Drawing Sheets

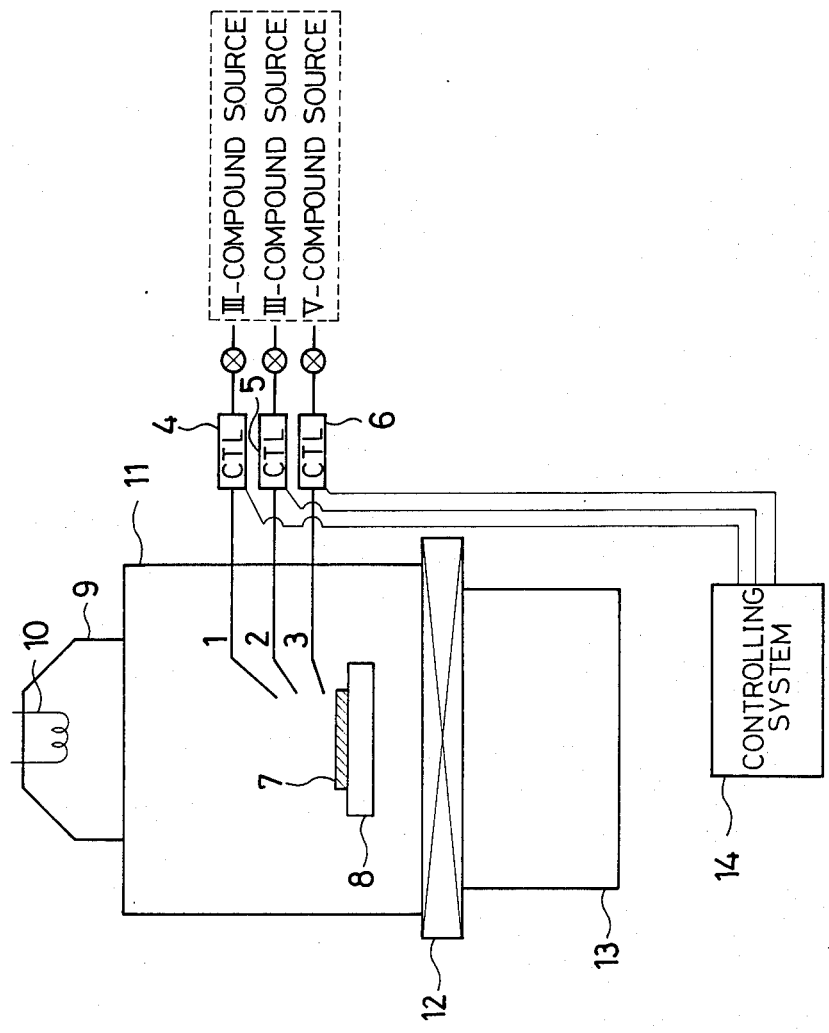

FIG. 4B
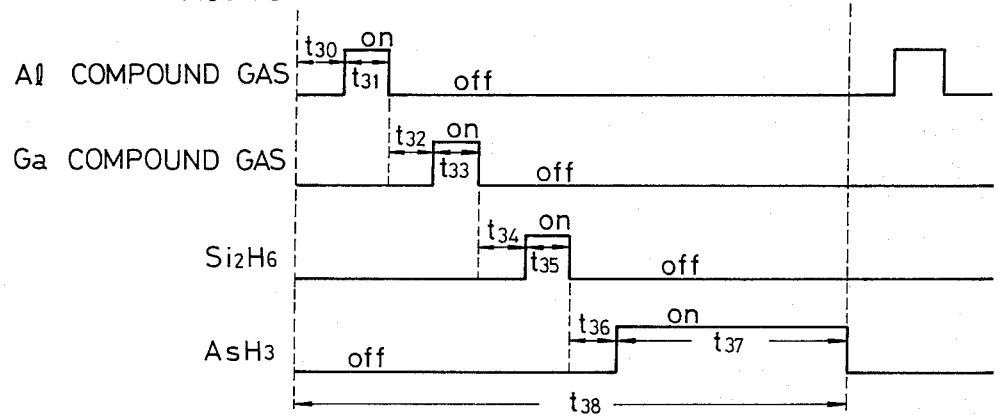
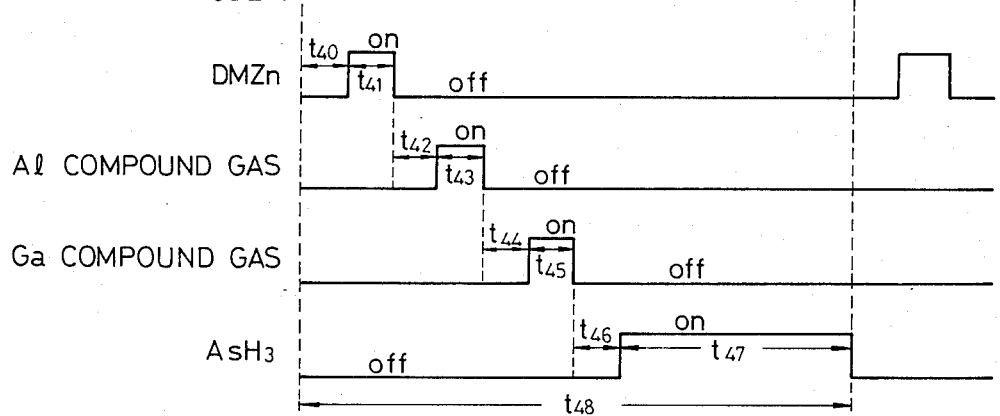

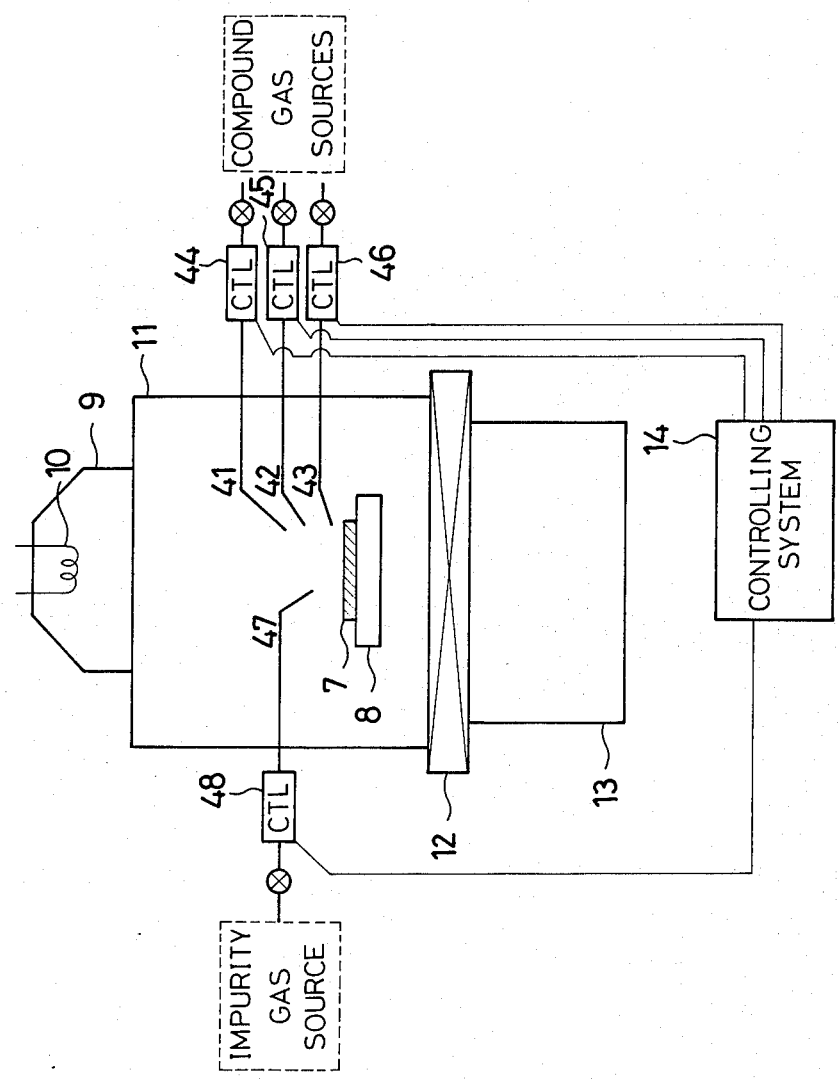

80  82
 81

80 / 80
 81   82

80 / 81
 82  82

F I G. 12 B
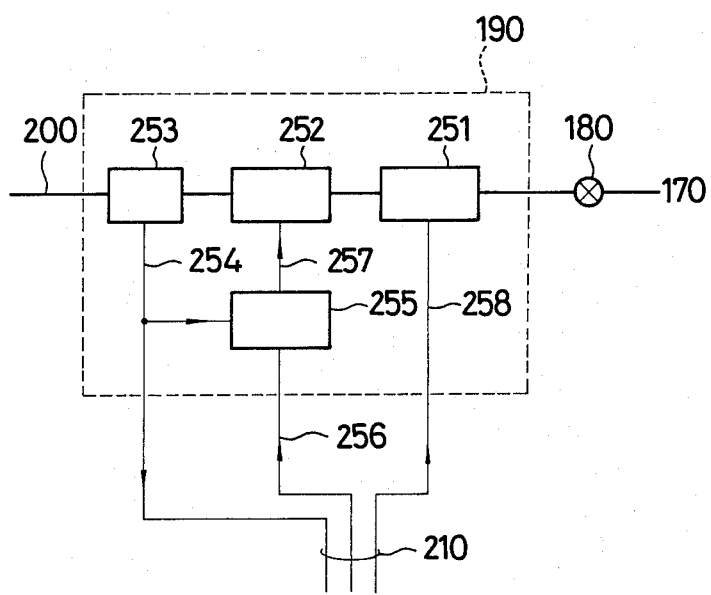

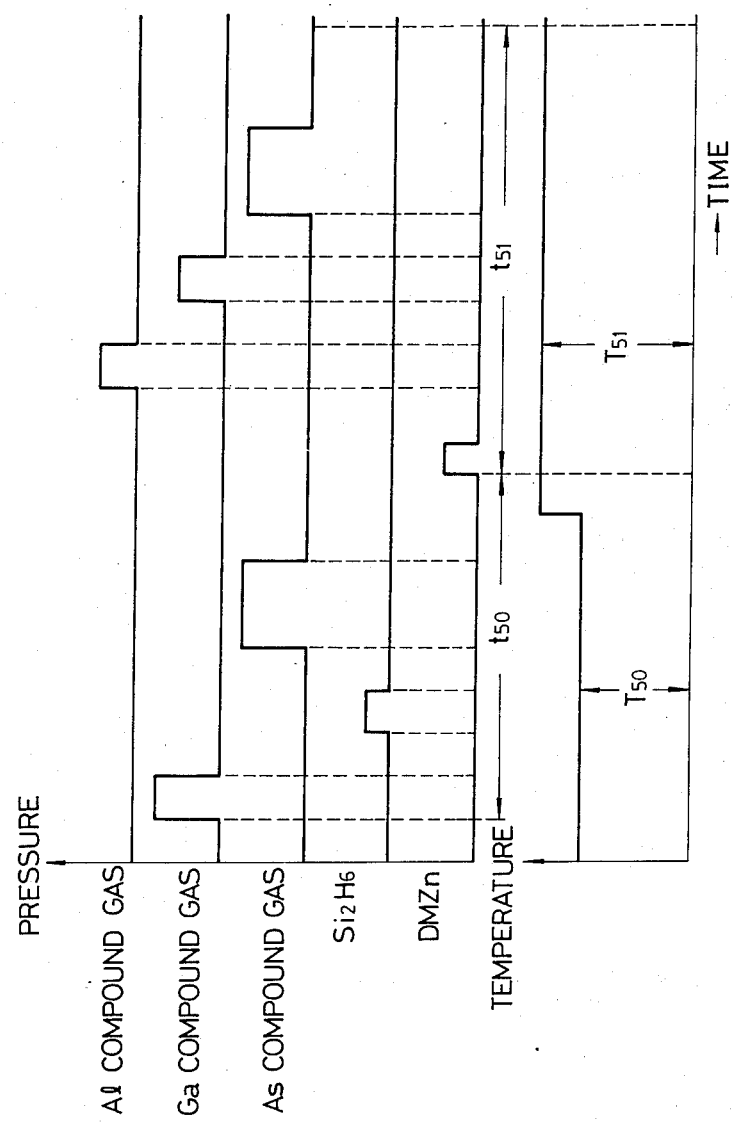

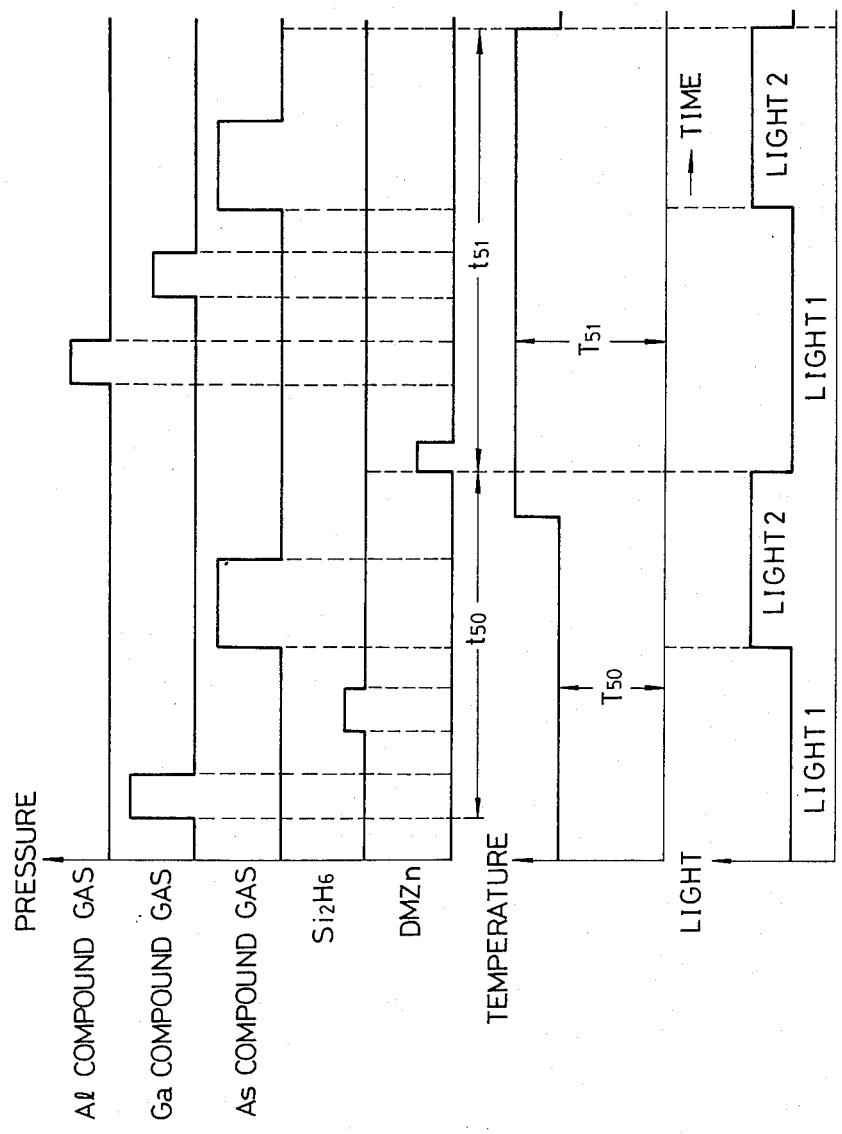

METHOD FOR EPITAXIAL GROWTH OF COMPOUND SEMICONDUCTOR USING MOCVD WITH MOLECULAR LAYER EPITAXY

FIELD OF THE INVENTION

This invention relates to an epitaxial growth technique of a compound semiconductor and, more particularly, to a method for the epitaxial growth of a mixed crystal semiconductor of more than ternary alloys in which the thickness of the semiconductor is controllable in monolayer accuracy

DESCRIPTION OF THE PRIOR ART

Various semiconductor devices using semiconductors of III and V group elements such as, for example, a semiconductor having a hetero junction between thin films of GaAs and $Al_xGa_{1-x}As$, and semiconductors having hetero junctions such as HEMT structures or superlattice structures utilizing the two-dimensional electron gas have hitherto been proposed.

With such proposals for the semiconductor devices, the development of excellent techniques for the thin film crystal growth of compound semiconductors has been more urgent.

A molecular beam epitaxy (hereinafter referred to as MBE), a metal organic vapor phase epitaxy (hereinafter referred to as MO-CVD) and a molecular layer epitaxy (hereinafter referred to as MLE) are well known in the art as techniques for forming semiconductors or thin films of such as GaAs or $Al_xGa_{1-x}As$.

The MO-CVD method is widely used since the apparatus carrying out this method is simple and suitable for the mass production. In the MO-CVD method, however, the thickness of the semiconductor thin film to be formed can not be controlled in monolayer accuracy. Thus, the MO-CVD method is not necessarily suitable for manufacturing the HEMT structure and the superlattice structure.

In the MBE method, since the raw material of a crystalline thin film being formed on a substrate crystal is heated and the vapor of the raw material is deposited on the substrate, the growing rate of the crystalline thin film can be kept very small so that the controllability of the thickness of the crystalline thin film is superior to that of the MO-CVD method. However, it is not easy to control the thickness of the thin film in monolayer accuracy. The problem is to overcome by using a monitoring according to the RHEED (reflection high energy electron diffraction) method. Furthermore, to obtain a high quality crystal in the MBE method, it is necessary to set up the growth temperature at 550°-600° C. The growth temperature is normally set at a temperature of 550°-600° C. for GaAs and even more than 600° C. for $Al_xGa_{1-x}As$. However, the fact that Al tends to more easily oxidize at such a high temperature leads to a serious defect that the formed crystal of $Al_xGa_{1-x}As$ has a poor flatness. Furthermore, if a steep impurity profile is desired in such a formed crystal, the redistribution of the impurity profile caused under such a high growing temperature would be a problem. Moreover, since the MBE method is based upon the vapor deposition process, there may also be caused deviations from the stoichiometric composition of a formed crystal thin film or interpositions of a crystal defect such as an oval defect in the formed crystal thin film.

The molecular layer epitaxy is well known as a crystal growth process. For the crystal growth of a compound containing III and V group elements, a compound gas containing a III group element and another compound gas containing a V group element are alternately introduced onto a substrate so that the crystal of the compound containing III and V group elements is grown monolayer by monolayer (see, for example J. Nishizawa, H. Abe and T. Kurabayashi; J. Electrochem. Soc. 132 (1985) 1197–1200). This method utilizes the adsorption and the surface reaction of compound gases. In the case, for example, of forming a crystal containing III and V group elements, the growth of a single monolayer of the crystal is attained by introducing a compound gas containing the III group element and another compound gas containing the V group element for one period of time, respectively. Since the method utilizes the monolayer adsorption of the compound gases, the monolayer by monolayer growth of the crystal is always attainable even though there is a fluctuation of the pressure of the introduced compound gases. In this method, although trimethyl gallium (hereinafter referred to as TMG) as alkylgallium and arsine ($AsH_3$) as arsenic hydride have conventionally been used, a high purity GaAs can be grown at a lower temperature by the substitution of triethyl gallium (hereinafter referred to as TEG) for TMG as alkylgallium (see, for example J. Nishizawa, H. Abe, T. Kurabayashi and N. Sakurai; J. Vac. Sci. Technol. A4(3), (1986) 706–710).

These methods such as described above relate, however, to the epitaxial growth of two-element compound semiconductors. In the epitaxial growth of ternary alloy semiconductors, the products superior in quality can not be, therefore, obtained by these methods. In the case of the MLE method, particularly, atomic layers of a single kind of element X or Y are stacked, alternately, to form a compound XY, whereas the notion of the atomic layer of a single kind of element does no longer hold for $A_xB_{1-x}$ in a mixed crystal $A_xB_{1-x}C$. For mixed crystals containing four elements or more, the situation is the same as the mixed crystal containing three elements.

SUMMARY OF THE INVENTION

In view of the foregoing, it is the main object of the present invention to provide a method for the epitaxial growth of compound semiconductors of a mixed crystal based upon the notion of the monolayer growth wherein the thickness of the epitaxially growing mixed crystal can be controlled in monolayer accuracy.

More specifically, it is an object of the present invention to provide a method for the epitaxial growth of a mixed crystal thin film containing three elements and more which is provided with a good reproducibility and suitable for the mass production, wherein the thickness of the epitaxially growing thin film can be controlled to a precision of several angstroms yet by a simple manner.

Also an object of the present invention is to provide a method for the epitaxial growth of a mixed crystal thin film containing three elements and more, wherein the mixed crystal thin film may epitaxially be grown at a relatively low growth temperature by suitably selecting raw materials so that compound semiconductor devices of high quality may be manufactured.

Other and further objects, features and advantages of the invention will appear more fully from the following description.

BRIEF DESCRIPTION OF THE DRAWINGS

FIG. 1A is a schematic view showing a crystal growth device for carrying out the epitaxial growth of $Al_xGa_{1-x}As$ layer according to the present invention.

FIG. 4B is a timing chart showing gas introduction modes for epitaxial growth processes accompanied with impurity dopings.

FIG. 6 is a schematic view showing a crystal growth device for carrying out the epitaxial growth of III–V and II–VI mixed crystal compound semiconductors containing three and four elements.

FIG. 12B is a schematic diagram showing the internal construction of a controlling unit of FIG. 12A for controlling the introduction mode of a compound gas.

FIG. 12C is a timing chart showing a process carried out by the crystal growth device shown in FIG. 12A.

FIG. 13B is a timing chart showing a process carried out by the crystal growth device of FIG. 13A.

DESCRIPTION OF THE PREFERRED EMBODIMENTS

Figure 1B:
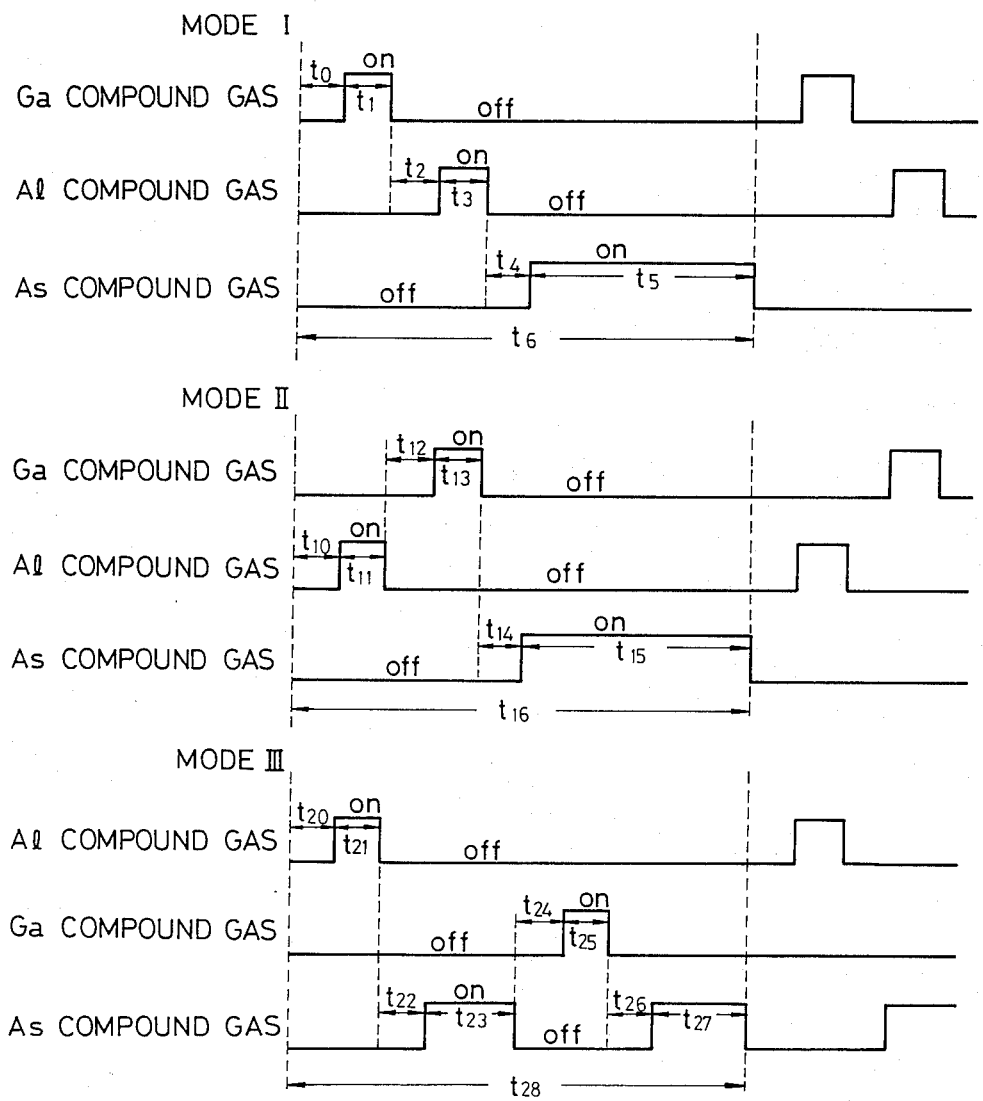
FIG. 1B is a timing chart showing various gas introduction modes for epitaxial growth processes.

A preferred embodiment of the invention for the epitaxial growth of $Al_xGa_{1-x}As$ single crystal thin film will now be described with reference to the schematic view in FIG. 1. A substrate crystal 7 of GaAs is mounted on a quartz susceptor 8 disposed in a crystal growth vessel 11. The vessel 11 is coupled to an evacuating system 13 via a gate valve 12 for evacuating its interior to an ultrahigh vacuum. The vessel 11 is also provided with an infrared ray lamp 10 enclosed in a casing 9 for irradiating the GaAs substrate crystal 7. The vessel 11 is further provided with three nozzle means 1, 2 and 3 for introducing alkyl aluminum as a gaseous compound containing aluminum (Al), alkyl gallium as a gaseous compound containing gallium (Ga) and arsine ($AsH_3$) as a gaseous compound containing arsenic (As), respectively. The nozzle means 1, 2 and 3 are connected via respective controlling units (CTL's) 4, 5 and 6 for controlling the introduced amount (per unit time) of respective gaseous compounds to their external sources, respectively. The controlling units 4, 5 and 6 are coupled to a controlling system 14 for controlling the introduction mode of the various gaseous compounds.

A single Crystal thin film of $Al_xGa_{1-x}As$ is grown in a manner as described below. First, the vessel 11 is evacuated to get a vacuum of about $10^{-9}$ to $10^{-10}$ Torr by opening the gate valve 12 and operating the evacuating system 13. The evacuating system 13 may be constituted with a vacuum pump system comprising a combination of pump units such as cryopumps and molecular turbo pumps. Then, the GaAs substrate 7 is heated to a crystal growth temperature of 300° to 500° C. by the infrared ray lamp 10 and the growth temperature is kept constant. Thereafter, alkyl aluminum as a gaseous compound containing aluminum, alkyl gallium as a gaseous compound containing gallium and arsine ($AsH_3$) as a gaseous compound containing arsenic are introduced in the vessel II according to a manner that will be described, in more detail, below to carrying out the epitaxial growth of $Al_xGa_{1-x}As$ single crystal while keeping the controllability of the thickness of $Al_xGa_{1-x}As$ thin films within several angstroms.

Examples of the mode for introducing the three kinds of gaseous compounds will now be described with reference to FIG. 1B in which three examples of the mode are shown. In each mode, on-off timings for the introduction of each gaseous compound are controlled by the controlling system 14 while the introduced amount per unit time of each gaseous compound is controlled by the controlling units 4, 5 and 6, respectively.

In a mode shown in FIG. 1B as mode I, gaseous alkyl gallium as a gas containing Ga is first introduced for a period of $t_1$ after an evacuation period of $t_0$. Then, the vessel 11 is evacuated again by operating the gate valve 12. After a period of $t_2$, gaseous alkyl aluminum is introduced as a gas containing Al for a period of $t_3$. Then, the vessel 11 is evacuated again for a period of $t_4$. Thereafter, gaseous arsine ($AsH_3$) is introduced as a gas containing As for a period of $t_5$. As a result of this one cycle of the operation which requires a total period of $t_6$, a single crystalline thin film which has a thickness of several angstroms is grown.

In this mode I, the crystal growth is repeatedly carried out by way of trial under various conditions as follows:

$t_0$=0 to 5 sec, $t_1$=1 to 6 sec, $t_2$=0 to 5 sec,
$t_3$=1 to 6 sec, $t_4$=0 to 5 sec, $t_5$=5 to 20 sec and $t_6$=7 to 47 sec.

In another mode shown in FIG. 1B as mode II, the same operation is carried out except that the order of the introduction between a gas containing Ga and a gas containing Al is interchanged.

In this mode II, the crystal growth is repeatedly carried out by way of trial under various conditions as follows:

$t_{10}$=0 to 5 sec, $t_{11}$=1 to 6 sec, $t_{12}$=0 to 5 sec,
$t_{13}$=1 to 6 sec, $t_{14}$=0 to 5 sec, $t_{15}$=5 to 20 sec and $t_{16}$=7 to 47 sec.

In still another mode shown as mode III in FIG. 1B, a gas containing As is introduced after the introduction and the evacuation period of a gas containing Al and, thereafter, the gas containing As is introduced again following the introduction and evacuation periods of a gas containing Ga.

In this mode III, the crystal growth is repeatedly carried out by way of trial under various conditions as follows:

$t_{20}=0$ to 5 sec, $t_{21}=1$ to 6 sec, $t_{22}=0$ to 5 sec, $t_{23}=5$ to 20 sec, $t_{24}=0$ to 5 sec, $t_{25}=1$ to 6 sec, $t_{26}=0$ to 5 sec, $t_{27}=5$ to 20 sec and $t_{28}=12$ to 72 sec.

In each mode described above, the internal pressure of the vessel 11 is kept at $10^{-6}$ to $10^{-4}$ Torr during the introducing period of gaseous alkyl aluminum, $10^{-6}$ to $10^{-4}$ Torr during the introducing period of gaseous alkyl gallium and $10^{-5}$ to $10^{-3}$ Torr during the introducing period of gaseous arsine.

Further, in each mode, one of materials such as trimethyl aluminum (TMA), triethyl aluminum (TEA) and triisobutyl aluminum (TIBA) is used by way of trial as the raw material of gaseous alkyl aluminum. Also, one of materials such as trimethyl gallium (TMG) and triethyl gallium (TEG) is used by way of trial as the raw material of gaseous alkyl gallium. In each case, arsine (AsH$_3$) is used as the raw material of the gas containing As.

Characteristics of epitaxial thin layers of Al$_x$Ga$_{1-x}$As which are obtained in various cases such as described above will now be described. The carrier density in an epitaxial layer of Al$_x$Ga$_{1-x}$As which is formed by using TMA as alkyl aluminum and TMG as alkyl gallium is $10^{18}$ to $10^{20}$ cm$^{-3}$ (p type) at room temperature. When TEG is used as alkyl gallium, the carrier density of $10^{15}$ to $10^{18}$ cm$^{-3}$ (p-type) is obtained by the use of TEA as alkyl aluminum while the carrier density of $10^{13}$ to $10^{15}$ cm$^{-3}$ (p-type) is obtained by the use of TIBA as alkyl aluminum so that an Al$_x$Ga$_{1-x}$As layer of higher purity may be obtained.

Further, when the three modes shown in FIG. 1B are carried out by using the same corresponding gaseous compounds and the same conditions for the internal pressure of the vessel 11 during the introduction of each gaseous compound in each mode, an epitaxial Al$_x$Ga$_{1-x}$As layer having the lowest carrier density may be obtained by the mode II. In a case in which TEG as alkyl gallium, TIBA as alkyl aluminum and AsH$_3$ are used, for example, an epitaxial layer having the carrier density of $10^{13}$ to $10^{15}$ cm$^{-3}$ (p-type) is grown in the mode II while a layer having the carrier density of $10^{15}$ to $10^{16}$ cm$^{-3}$ (p-type) is grown in the mode I.

In any case or mode, the thickness of a thin film of Al$_x$Ga$_{1-x}$As which is grown in a single cycle of the introduction of gases is about 1 to 10 Å. Thus, by suitably selecting the internal pressure of the vessel 11 during the introducing period of each compound gas and the period of time for introducing each compound gas, an epitaxial growth of Al$_x$Ga$_{1-x}$As thin film having the thickness corresponding to a single monolayer may easily be obtained in the single cycle of the introduction of gases. The thickness of one single monolayer is about 2.8 Å at (100) plane and about 3.3 Å at (111) plane.

Furthermore, any value within 0 to 1 for x the composition of Al in Al$_x$Ga$_{1-x}$As may also be obtained by suitably selecting the internal pressure of the vessel 11 during the introducing period of each compound gas and the introducing period thereof.

The temperature of the crystal growth is kept at a value of 300° to 500° C. Since the redistribution of the impurity profile is suppressed due to such a rather lower growth temperature and, in addition, since the controllability for the thickness of the thin film being grown is excellent, a steep impurity profile may be attained in a multilayer thin film comprising GaAs and Al$_x$Ga$_{1-x}$As.

Figure 2:
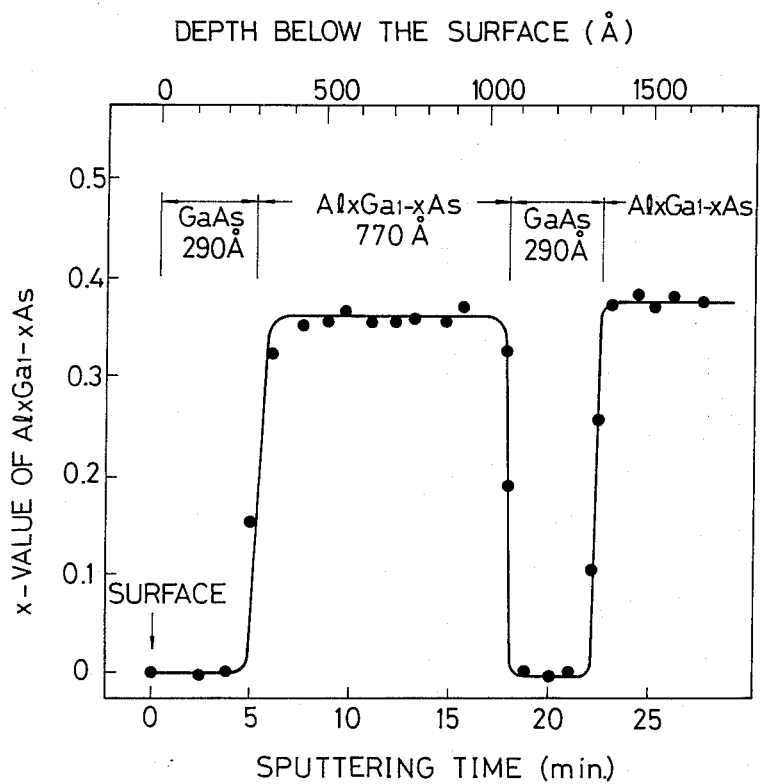
FIG. 2 is a graph showing a measured example of Al component in a multilayer structure of $Al_xGa_{1-x}As$ and GaAs.

FIG. 2 shows a depthwise profile of the composition x in Al$_x$Ga$_{1-x}$As included in a multilayer structure GaAs/Al$_x$Ga$_{1-x}$As/GaAs/Al$_x$Ga$_{1-x}$As . . . which is manufactured by using a group of materials (TEG-AsH$_3$) and another group of materials (TEG-TEA-AsH$_3$). The composition x is measured by the Auger electron spectroscopy. The thickness of a GaAs layer in this multilayer structure is attained in a similar manner to such as described above by using the group of materials (TEG-AsH$_3$) and repeating 100 cycles of the serial introduction of such compound gases. Also, the thickness of an Al$_x$Ga$_{1-x}$As in this multilayer structure is attained by using the group of materials (TEG-TEA-AsH$_3$) and repeating 250 cycles of the serial introduction of such compound gases. Conditions for such introduction of gases are set so as to obtain an x value of 0.36 to 0.37. As will be seen from the graph shown in FIG. 2, a hetero junction between GaAs and Al$_x$Ga$_{1-x}$As which has a steep impurity profile may be obtained.

Figure 3A:
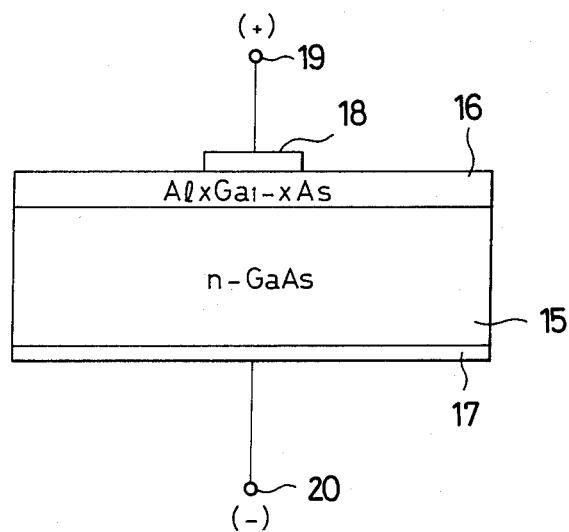
FIG. 3A is a sectional view showing the structure of a metal-insulator-semiconductor (MIS) capacitor manufactured as a trial according to the present invention.

FIG. 3A shows a sectional view of a MIS (metal-insulator-semicondctor) capacitor manufactured as a trial by using a group of materials (TEG-TIBA-AsH$_3$). A layer 16 of Al$_x$Ga$_{1-x}$As is epitaxially grown at a temperature of 350° to 550° C. on a Si doped ($3 \times 10^6$ cm$^{-3}$) n-type GaAs substrate crystal 15. On the layer 16, an electrode 18 of Al is formed and a terminal 19 is attached thereto. On the bottom surface of the substrate 15, an electrode 17 of AuGe is formed and a terminal 20 is attached thereto. The thickness of the Al$_x$Ga$_{1-x}$As layer 16 is about 700 Å and the diameter of the Al electrode 18 is 500 μm.

Figure 3B:
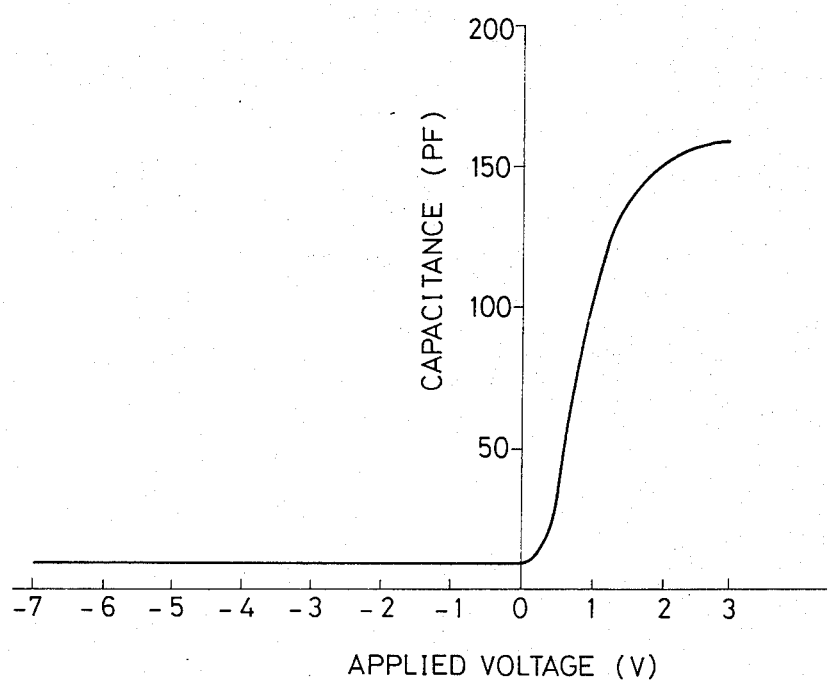
FIG. 3B is a characteristic diagram showing the relation between the capacitance and the applied voltage of the MIS capacitor.

The capacitance to voltage (C-V) characteristic curve of the MIS capacitor is shown in FIG. 3B. It will be seen that a high purity epitaxial layer of Al$_x$Ga$_{1-x}$As may be obtained. It will also be noted that, according to the present invention, crystals of good quality may be grown at a lower growth temperature in comparison with prior methods such as MO-CVD or MBE.

Figure 4A:
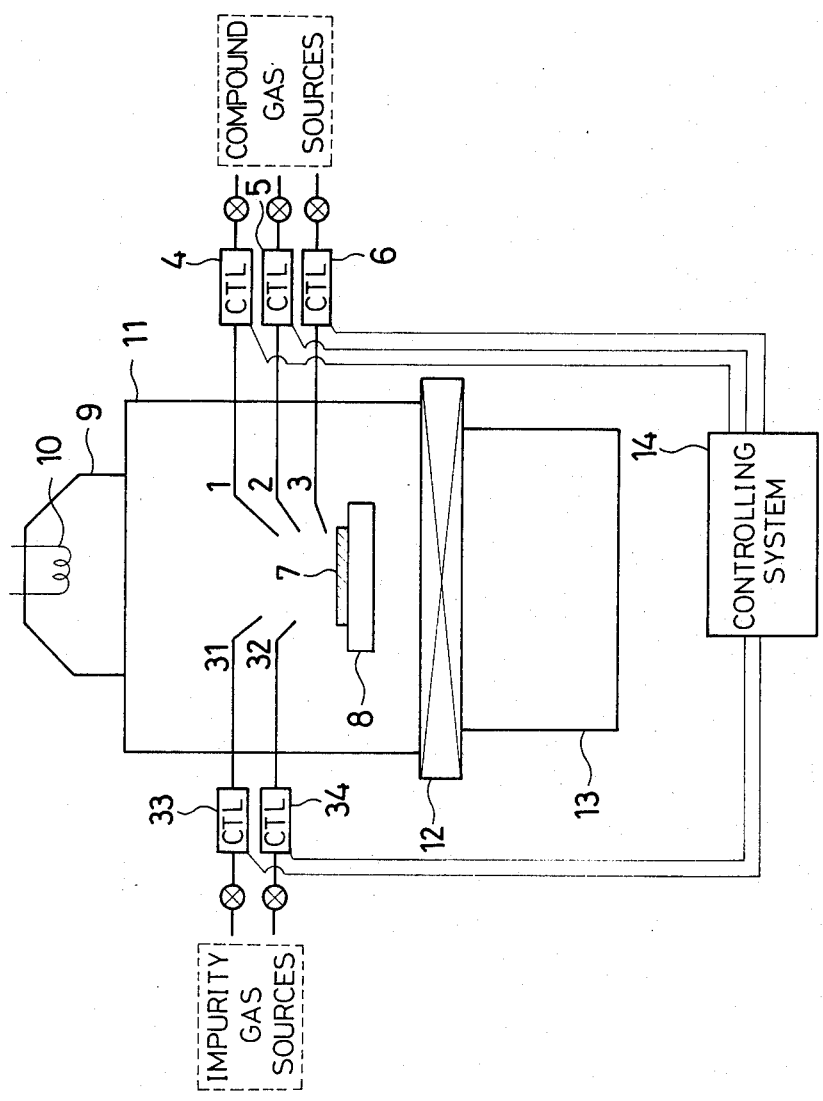
FIG. 4A is a schematic view showing a crystal growth device for carrying out the epitaxial growth of $Al_xGa_{1-x}As$ doped with impurities.

FIG. 4A shows a schematic view of a device for manufacturing Al$_x$Ga$_{1-x}$As epitaxial layers of p-type and n-type by means of doping. One of gaseous compounds containing IV or VI group elements such as disilane (Si$_2$H$_6$), selenium hydride (H$_2$Se), dimethyl selenium (DMSe) and diethyl tellurium (DETe) is introduced from an external source thereof via a controlling unit 33 for controlling the introduced amount of the gaseous compound and a nozzle 31 into a crystal growth vessel 11. Also, one of gaseous compounds such as dimethyl zinc (DMZn) and dimethyl cadmium (DMCd) is introduced from an external source thereof via a controlling unit 34 for controlling the introduced amount of the gaseous compound and a nozzle 32 into the vessel 11. The introduction timing of gases introduced through the nozzles 31 and 32 is controlled by a controlling system 14 in a similar manner to that described with reference to FIG. 1A. Other parts and functions thereof are same as or correspond to that of FIG. 1A and the description will not be repeated here.

An epitaxial layer of Si doped n-type Al$_x$Ga$_{1-x}$As may, for example, be formed by introducing Si$_2$H$_6$ and that of Zn doped p-type Al$_x$Ga$_{1-x}$As may be formed by introducing DMZn The gas introduction modes for these cases are shown in FIG. 4B. These modes for the above described cases in which TEG as a gaseous compound containing Ga and TIBA as a gaseous compound containing Al are used by way of example will now be described.

In a mode IV of FIG. 4B which is the case that $Si_2H_6$ is introduced, various gaseous compounds are introduced in the order of TIBA, TEG, $Si_2H_6$ and $AsH_3$. In this mode, any gaseous compound containing any III group element and a gaseous compound containing an impurity element which will occupy the sites of III group atoms in a crystal are alternately introduced. Such mode is most effective in the doping with the use of $Si_2H_6$ and an n-type $Al_xGa_{1-x}As$ ($10^{16}$ to $10^{19}$ cm$^{-3}$) layer may be manufactured. Another mode V in FIG. 4B is the case in which DMZn is introduced. In this case, the most effective doping is attained when various gases are introduced in the order of DMZn, TIBA, TEG and $AsH_3$ as shown in the mode V and a p-type $Al_xGa_{1-x}As$ ($10^{16}$ to $10^{20}$ cm$^{-3}$) layer may be manufactured.

A gaseous compound containing an impurity may be introduced before and after each introduction, in the order, of a gaseous compound containing $III_A$ group element, that containing $III_B$ group element and that containing V group element or, in the order, of V, $III_A$ and $III_B$. In case of III-V mixed crystal, main impurities are II, IV and VI group elements. These impurities may be introduced in the order, II, $III_a$, $III_B$, IV, V and VI.

Figure 5:
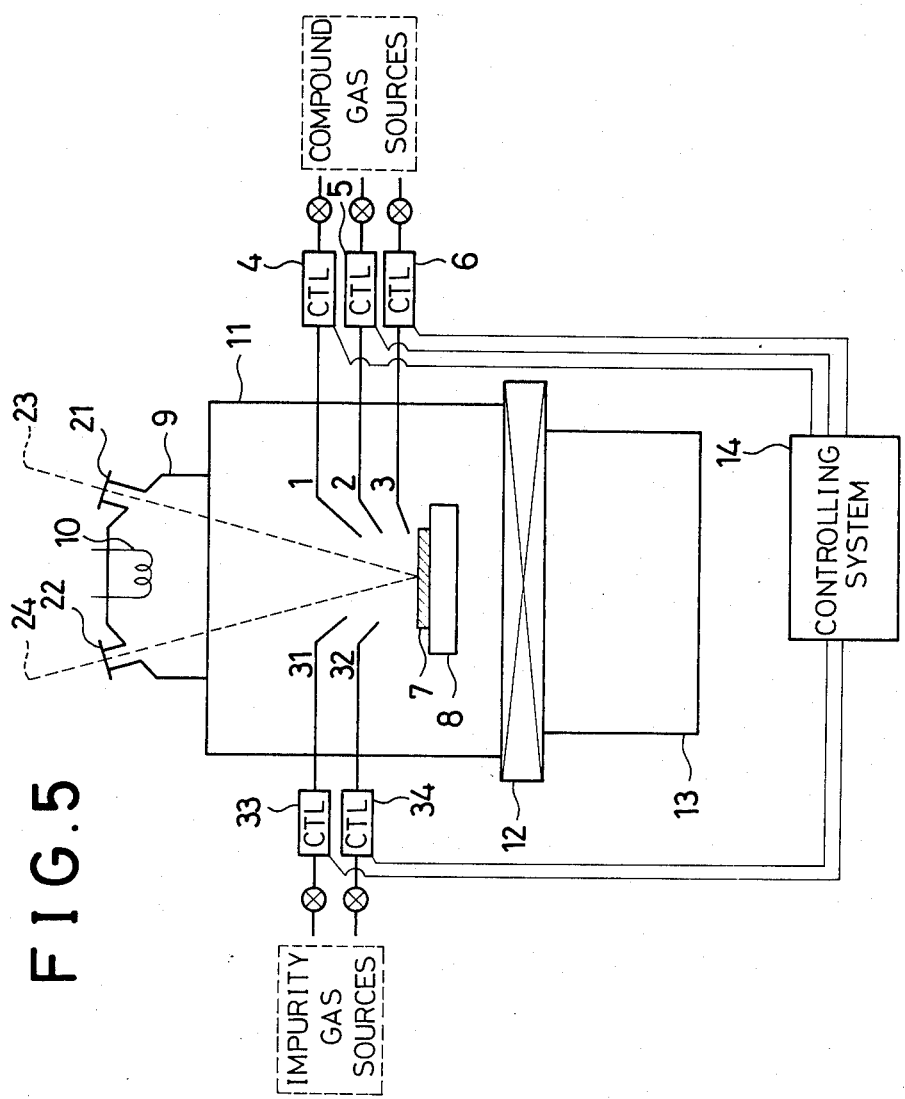
FIG. 5 is a schematic view showing a crystal growth device for carrying out the epitaxial growth of $Al_xGa_{1-x}As$ accompanied with light irradiation.

FIG. 5 shows a further form of the crystal growth device, which is designed to irradiate the substrate crystal during the crystal growth. The substrate 7 is irradiated with ultraviolet rays 23 and 24 which are emitted from external sources such as excimer lasers, argon ion lasers, xenon lamps or mercury lamps and transmitted through synthetic quartz windows 21 and 22. As a result, the crystal growth temperature may be reduced to ensure growth of a single crystal having a still higher quality. Thus, for example, a high purity $Al_xGa_{1-x}As$ epitaxial layer having a carrier density of about $10^{14}$ cm$^{-3}$ may be obtained at a low growth temperature of 300° to 400° C. by using a group of materials (TEG-TIBA-$AsH_3$)

Further, the doping efficiency may be controlled by synchronizing an irradiation of light having a specific wave length with the doping periods such as the introduction periods of $Si_2H_6$ or DMZn. In accordance with such purpose, two kinds of light 23 and 24 having different wave lengths may be available through the windows 21 and 22, respectively, to irradiate the substrate 7.

FIG. 6 shows a further embodiment of the crystal growth device for manufacturing quaternary alloys of III-V compound mixed crystals.

The manufacturing process, by way of example, for a quaternary alloy $In_xGa_{1-x}As_yP_{1-y}$ of III-V compound semiconductors will now be described. In this process, gaseous alkyl indium is introduced from an external source via a controlling unit (CTL) 44 for controlling the introduced amount of gaseous alkyl indium and a nozzle 41 into a crystal growth vessel 11. In like manners, gaseous alkyl gallium via a controlling unit (CTL) 45 and a nozzle 42, and gaseous $AsH_3$ via a controlling unit (CTL) 46 and a nozzle 43 are introduced, respectively, into the vessel 11. Also, gaseous phosphine ($PH_3$) as an impurity gas is introduced from an external source thereof via a controlling unit 48 and a nozzle 47 into the vessel 11.

By alternately introducing these gases on a substrate crystal 7, an $In_xGa_{1-x}As_yP_{1-y}$ single crystalline thin film may be grown at a low temperature of 300° to 500° C. while keeping the controllability of the growing film thickness within several angstroms.

Alternatively, a single crystalline thin film of $Zn_xSe_{1-x}Te$ may also be grown at a low temperature of 300° to 500° C. in a similar manner as described above by substituting dimethyl zinc (DMZn), selenium hydride ($H_2Se$) and dimethyl tellurium (DMTe) for alkyl indium, alkyl gallium and $AsH_3$ Further, a single crystalline thin film of $Hg_xCd_{1-x}Te$ may also be grown by using gases of dimethyl mercury (DMHg), dimethyl cadmium (DMCd) and dimethyl tellurium (DMTe).

Figure 7A:
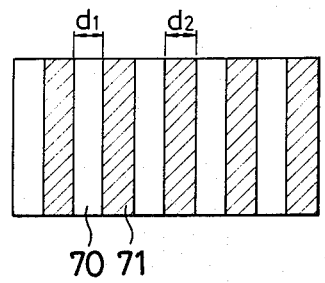
FIGS. 7 to 11 are schematic sectional views illustrating the structures of ultrathin films obtained by the epitaxial growth according to the present invention.

FIG. 7A is an embodiment according to the present invention in which a manufacturing process for a superlattice structure is schematically shown. In the superlattice structure shown in FIG. 7A, a GaAs layer 70 having the thickness $d_1$ and an $Al_xGa_{1-x}As$ layer having the thickness $d_2$ are alternately and successively grown. According to the invention, the thickness $d_1$ and $d_2$ may be controlled dimensionally as precise as a monolayer. Thus, the minimum thickness in the superlattice structure is that of a monolayer. Further, the thickness $d_1$ and $d_2$ may easily be controlled so as to an arbitrary number of times of a single monolayer thickness may be attained as required.

Furthermore, by using a doping process such as described above, superlattice structures such as an n-GaAs/n-$Al_xGa_{1-x}As$ superlattice structure and an n-GaAs/p-$Al_xGa_{1-x}As$ superlattice structure may also be manufactured.

Figure 7B:
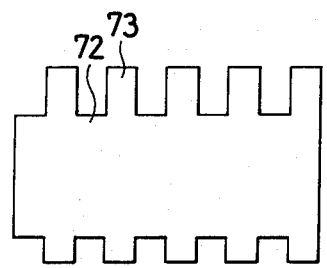
Figure 7C:
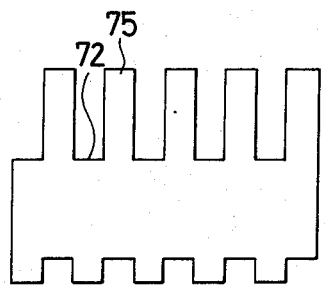

FIG. 7B shows the band structure of the n-GaAs/n-$Al_xGa_{1-x}As$ superlattice structure comprising a band structure 72 of n-GaAs and a band structure 73 of n-$Al_xGa_{1-x}As$. Also, FIG. 7C shows the band structure of the n-GaAs/p-$Al_xGa_{1-x}As$ superlattice structure comprising a band structure 72 of n-GaAs and a band structure 75 of p-$Al_xGa_{1-x}As$.

In the processes for manufacturing such superlattice structures, the thickness of each growth layer may be controlled in accordance with a predetermined design in like manner as the embodiment of FIG. 7A. Further, the doping may be carried out in the same manner such as shown in FIGS. 4A and 4B for $Al_xGa_{1-x}As$, and in like manner of FIG. 4B without Al for GaAs.

Further, an n-$Al_xGa_{1-x}As$/p-$Al_xGa_{1-x}As$ superlattice structure may also be manufactured according to the method shown in FIGS. 4A and 4B. Alternate doping of n-type and p-type impurities with or without changing the composition of Al in monolayer by monolayer manner may also be carried out. Of course, the thickness of n-$Al_xGa_{1-x}As$ and p-$Al_xGa_{1-x}As$ may be changed, respectively.

Figure 8A:
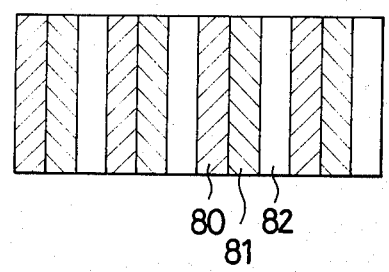
Figure 8B:
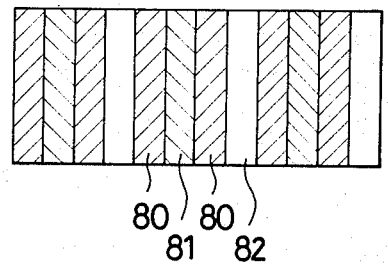
Figure 8C:
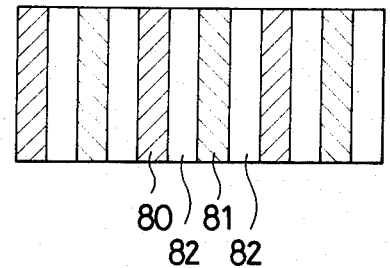

Embodiments of poly-type superlattice structures are shown in FIGS. 8A to 8C. There are shown, by way of example, three those superlattice structures each comprising a combination of three kind of semiconductors such as, for example, InAs 80, AlSb 81 and GaSb 82. Thus, FIG. 8A shows a superlattice structure comprising a unit periodic structure 80, 81 and 82, FIG. 8B shows a superlattice structure comprising a unit periodic structure 80, 81, 80 and 82, and FIG. 8C shows a superlattice structure comprising a unit periodic structure 80, 82, 81 and 82. The combinations, conduction types of layers, the impurity density in each layer and the thickness of layers may be changed as required.

Since the superlattice structure is grown in monolayer by monolayer manner according to the method of the invention, ununiformity of microscopic atom configuration is eliminated from the manufactured mixed crystals so that the superlattice structure having a periodic structure produced by a combination of ideal mixed crystals regularly arranged in atomic accuracy may be manufactured. Furthermore, since the crystal growth may be carried out at a low temperature of about 300° C., a superlattice structure having a steep impurity profile may also be manufactured with the use of impurity doping.

Figure 9:
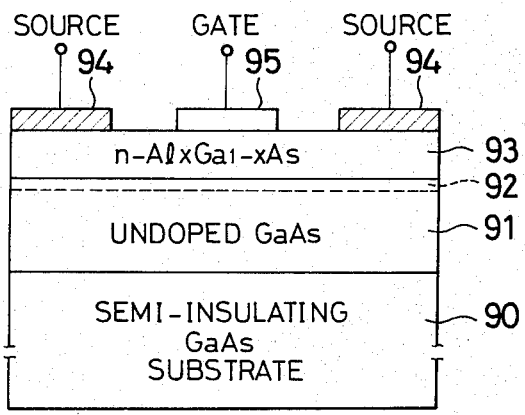

Referring now to FIG. 9, a process of the invention for manufacturing a HEMT (high electron mobility transistor) such as shown in FIG. 9 will be described. Undoped GaAs layer 91 having a thickness of about 200 monolayers is, first, grown on a semi-insulating GaAs substrate 90. Then, a Si doped $Al_xGa_{1-x}As$ ($x\approx0.3$) layer 93 having a thickness of 30 to 40 monolayers is grown. Thereafter, source, gate and drain electrodes are formed. The source electrode 94 is an ohmic electrode of AuGe/Au and the gate electrode 95 is a Ti/Pt/Au electrode. In the manufacturing process of the invention, since the ununiformity in microscopic configuration of atoms in the mixed crystals may be eliminated, the scattering, which may be occurred at the interface between the n-$Al_xGa_{1-x}As$ layer 93 and the undoped GaAs layer 91, of electrons in a two-dimensional electron gas layer 92 is minimized so that a highly efficient transistor may be manufactured. Of course, any designed values of thickness of layers, composition x and impurity densities may be attained.

Another process of the invention for manufacturing a diode utilizing the resonance tunneling effect will now be described with reference to FIG. 10 in which a schematic sectional view of such diode is shown. An n+-GaAs layer 101 having 100 monolayer thickness and an impurity density of about $10^8$ cm$^{-3}$ is, first, grown on an n+-GaAs substrate 100. Thereafter, an $Al_xGa_{1-x}As$ high resistance layer 102 having 15 to 20 monolayer thickness, an n-GaAs layer 103 having 15 to 20 monolayer thickness and an impurity density of $10^{17}$ cm$^{-3}$, an $Al_xGa_{1-x}As$ high resistance layer 104 having 15 to 20 monolayer thickness and an n+-GaAs layer 105 having 100 monolayer thickness and an impurity density of cm$^{-3}$ are successively grown. Finally, an ohmic contact 106 of such as, for example, AuGe/Ni is formed on the top surface of the layer 105 and the bottom surface of the substrate 100, respectively. Such a device will exhibit a negative resistance when a DC voltage is applied in normal or reversed direction at 4K to the room temperature so that the device is available as an oscillator, a mixer or a detector in millimeter wave and submillimeter wave bands.

Figure 11:
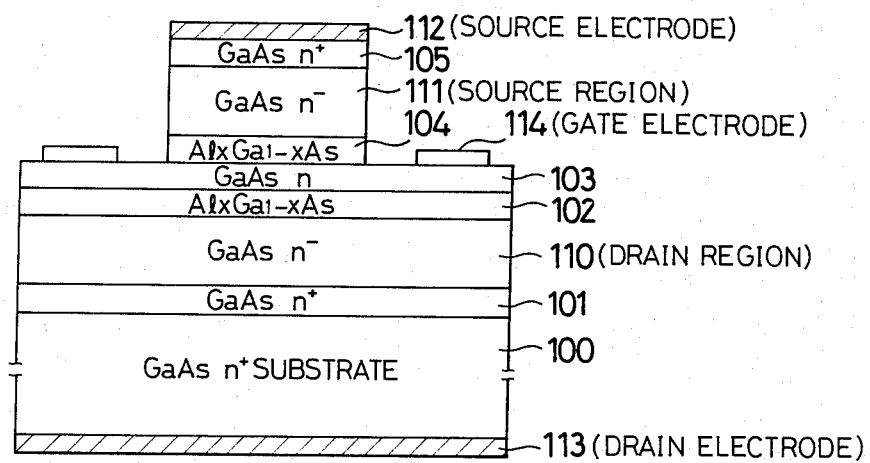

Still another process of the invention for manufacturing a transistor in which the resonant tunneling structure such as described above is disposed in the channel of a field effect transistor will now be described with reference to FIG. 11 in which a schematic sectional view of such transistor is shown.

Figure 10:
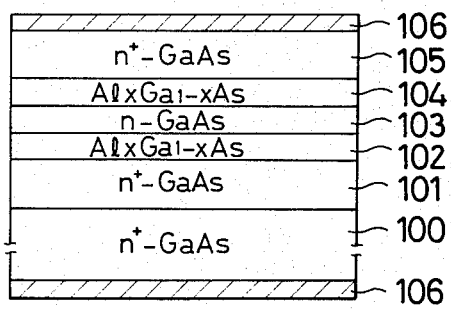

In the drawing, like reference characters designate like parts as shown in FIG. 10 and the description thereof will not be repeated. In the channels of a drain region 110 and a source region 111, the impurity density may be designed to have a value less than about $10^{16}$ cm$^{-3}$ so that the velocity of electrons may not be affected due to the lattice scattering in these regions. Further, a source electrode 112 and a drain electrode 113 are formed by Au-Ge/Ni/Au while a gate electrode 114 is formed with a Schottky gate of such as Al, Pt, Mo and Cr or an ohmic electrode of such as well known Au-Ge/Ni/Au.

The thickness of the drain region 110 and the source region 111 may be designed in such a manner that the total thickness of the drain side is thicker than that of the source side so as to keep the withstand voltage between gate and drain larger than that between source and gate. Further, in the normal operation of the transistor, the thickness W of the drain region may be designed by considering the cut-off frequency $f_c$ as the criterion. Thus, when $f_c$ is, for example, 10 GHz, 100 GHz, 1000 GHz (=1 THz) and 10 THz, respectively, W may be designed as about 100 $\mu$m, 1 $\mu$m, 1000 Å and 100 Å, respectively.

Also, when the transit time effect of gate to drain is utilized, the thickness of the drain region may be designed so as to result the transit angle $\theta$ of $3\pi/2$ if the time constant between gate and source is negligible and the maximum injection at a phase of $\pi/4$ is intended while that of the drain region may be designed so as to result the transit angle of $\pi/2$ to $\pi$ if the time constant between gate and source is no longer negligible and the maximum injection at a phase of $\pi/2$ to $\pi$ is intended. When $\theta=\pi$, then $f_{osc\ max}=V_s/2W$ where $V_s$ and W are the carrier velocity and the thickness of the drain region, respectively. Thus, in order to set $f_{osc\ max}$ as 100 GHz, 1000 GHz (=1 THz) or 10 THz, W may be chosen as 0.5 $\mu$m, 500 Å or 50 Å, respectively. Of course, the thickness of the resonance tunneling parts 102 to 104 is reduced corresponding to the increasing $f_c$'s. The impurity density in n+-GaAs layers 101 and 105 may be designed as more than $10^{18}$ cm$^{-3}$ while that in the resonance tunneling junction may be designed as same as that in FIG. 10 or a predetermined value.

It is apparent that the crystal growth method of the invention may equally well be embodied for manufacturing ultra thin film structures other than the embodiments such as described above with reference to FIGS. 7 to 11. Also, the embodiments has been described above referring to GaAs and $Al_xGa_{1-x}As$ as growth layers. The process of the invention, however, may also be applied to such as other III-V compounds and mixed crystals thereof, II-VI compounds and mixed crystals thereof, and hetero-junctions between III-V and II-VI compounds.

In the above described embodiments of FIGS. 7 to 11, although various superlattice structures and heterojunctions may be grown in the monolayer by monolayer manner, it is necessary to control the temperature of the substrate, the pressure and the introduction periods of gaseous compounds containing component elements and impurity elements as adjustable parameters.

Although only the controlling means for the introduction of various gases has already been described with reference to FIGS. 1, 4, 5 and 6, another embodiment of the invention in which a desired ultra thin film structure may automatically be carried out will now be described.

Figure 12A:
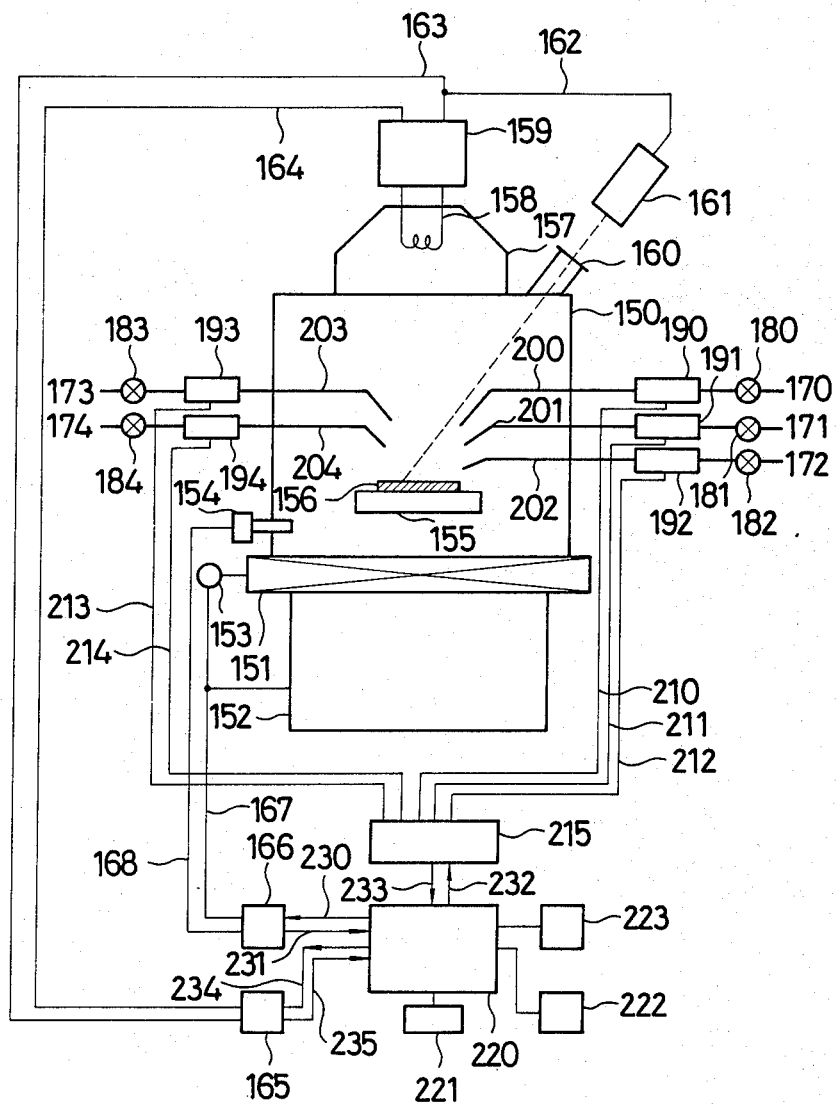
FIG. 12A is a schematic view showing the construction of a crystal growth device automatically carrying out the epitaxial growth processes according to the present invention.

FIGS. 12A is a schematic block diagram of an epitaxial growth device including controlling parts thereof for carrying out the process according to the invention.

The device comprises a crystal growth vessel 150, a gate valve 151, an evacuating system 152, a driving means 153 for driving the gate valve 151, a vacuum gauge 154, a quartz susceptor 155 for mounting a semiconductor substrate 156, a lamp 158 for heating the semiconductor substrate 156 and a lamp housing 157. Most of these parts correspond to those parts shown in FIGS. 1A, 4A, 5 and 6.

The heating temperature of the lamp 158 is controlled by a lamp temperature controlling unit 159 comprising such a power supply and a thermostat. The temperature of the substrate 156 is observed by a radiation thermometer or pyrometer 161 through a window 160. An output 162 from the thermometer is transmitted with an output 163 for monitoring the lamp heating temperature to a temperature controlling unit 165 for controlling the temperature of the substrate from which a signal 164 is transmitted to the unit 159. The internal pressure of the vessel 150 is measured by the vacuum gauge 154 and an output signal 168 of the vacuum gauge 154 is transmitted to a controlling unit 166 for controlling the evacuating system 152. A controlling signal 167 from the unit 166 is transmitted to the evacuating system 152 and the driving means 153. Gaseous compounds 170, 171, 172, 173 and 174 containing one of component elements or impurity elements, respectively, are introduced via respective stop valve 180, 181, 182, 183 and 184, respective controlling unit 190, 191, 192, 193 and 194, and respective nozzle 200, 201, 202, 203 and 204 into the vessel 150. Manually operated valves or electromagnetic valves may be available for the valves 180, 181, 182, 183 and 184. Also, the controlling units 190, 191, 192, 193 and 194 control the pressure and the introducing periods of each gaseous compound, respectively. The manner to control the pressure and the introduction periods of each gaseous compound will, hereinafter, be described more specifically with reference to FIG. 12B. Input signals to control the units 190, 191, 192, 193 and 194, respectively, and output monitoring signals thereof are transmitted via signal lines 210, 211, 212, 213 and 214, respectively. A controlling system comprising a computer CPU 220, an input terminal 221, a memory 222, an image output terminal 23 and an output printer operating system not shown is connected through an interface circuit 215 to the group of units 190, 191, 192, 193 and 194. In response to a monitoring input signal 233, the computer transmits a controlling signal 232. Also, in response to a vacuum monitoring input signal 231, the computer transmits a controlling signal 230. Further, in response to a temperature monitoring input signal 235, the computer transmit a controlling signal 234.

FIG. 12B shows a schematic block diagram illustrating a part of the gas controlling unit. Since the manner of the operation of various units 190 to 194 is the same, the description will be limited only to the introduction of one gaseous compound. Thus, the operation, for example, of the unit 190 will be described.

The introduction of the gaseous compound 170 is controlled by a stop valve 251 controlling introducing and non-introducing periods in response to a control signal transmitted from the computer through the line 210. The pressure of the gaseous compound 170 is controlled by a mass flow controller 252 in response to an output controlling signal 257 from a pressure controlling circuit 255. The pressure controlling circuit 255 is an electronic circuit comprising a feedback control using such as well known transistors, diodes and IC's. The circuit 255 generates the output controlling signal 257 in response to an output signal 254 from a manometer 253 and a controlling signal 256 generated from the computer in response to the output signal 254 of the manometer 253.

Referring now to FIG. 12C, there is shown a mode for the introduction of various gases together with a temperature controlling diagram which may be used for carrying out a crystal growth process in which n-GaAs layers and p-Al$_x$Ga$_{1-x}$As layers are alternately grown on an n-GaAs substrate in monolayer by monolayer manner by means of the controlling system described above. During a period of $t_{50}$, a single monolayer of n-GaAs may be grown at a temperature $T_{50}$ and, subsequently, a single monolayer of p-Al$_x$Ga$_{1-x}$As may be grown in a period of $t_{51}$ temperature $T_{51}$.

Of course, an epitaxial layer of such as 100 or 1000 monolayer thickness may also be grown. In such a case, a program, in an appropriate language, instructing 100 or 1000 monolayer thickness may be input to the computer. Thus, any desired ultrathin film structure may be grown. Since a crystal growth of a layer, for example, of two monolayer thickness may be carried out by adjusting the condition, such manner may be available for the save of growth time.

Further, by using the program shown in FIG. 12C as a monitoring input to display on a Braun tube (CRT) as the image output terminal 223, a visual monitoring may be carried out. Also, memory devices such as a floppy disk, a cassette tape recorder and a hard disk may be used as the memory 222 for recording and reproducing the program of the process for manufacturing the ultrathin film structure.

Furthermore, consecutive crystal growth may be carried out by using an automatic transport device for the insertion and take out operations of the substrate into and out of the crystal growth vessel. Thus, the mass production of an ultrathin film comprising layers of different structures may be carried out by using a controlling program such as described above in combination with a program for controlling the automatic transport device.

Still further, since the monolayer growth may be carried out in a simple manner by using a simple manometer and a controlling system for controlling the gas introduction and the substrate temperature, high quality wafers comprising ultrathin epitaxial layers may easily be manufactured in contrast to the MBE method.

In the computer of FIG. 12A, there is shown only one input terminal. However, an operating system of multitask or multijob type comprising a plurality of input terminals to the computer may also be used for carrying out the crystal growth control while programming other new programs for the crystal growth.

Still another embodiment of the invention, in which the irradiation of the substrate with light during the crystal growth such as shown in FIG. 5 is automated, will now be described.

Figure 13A:
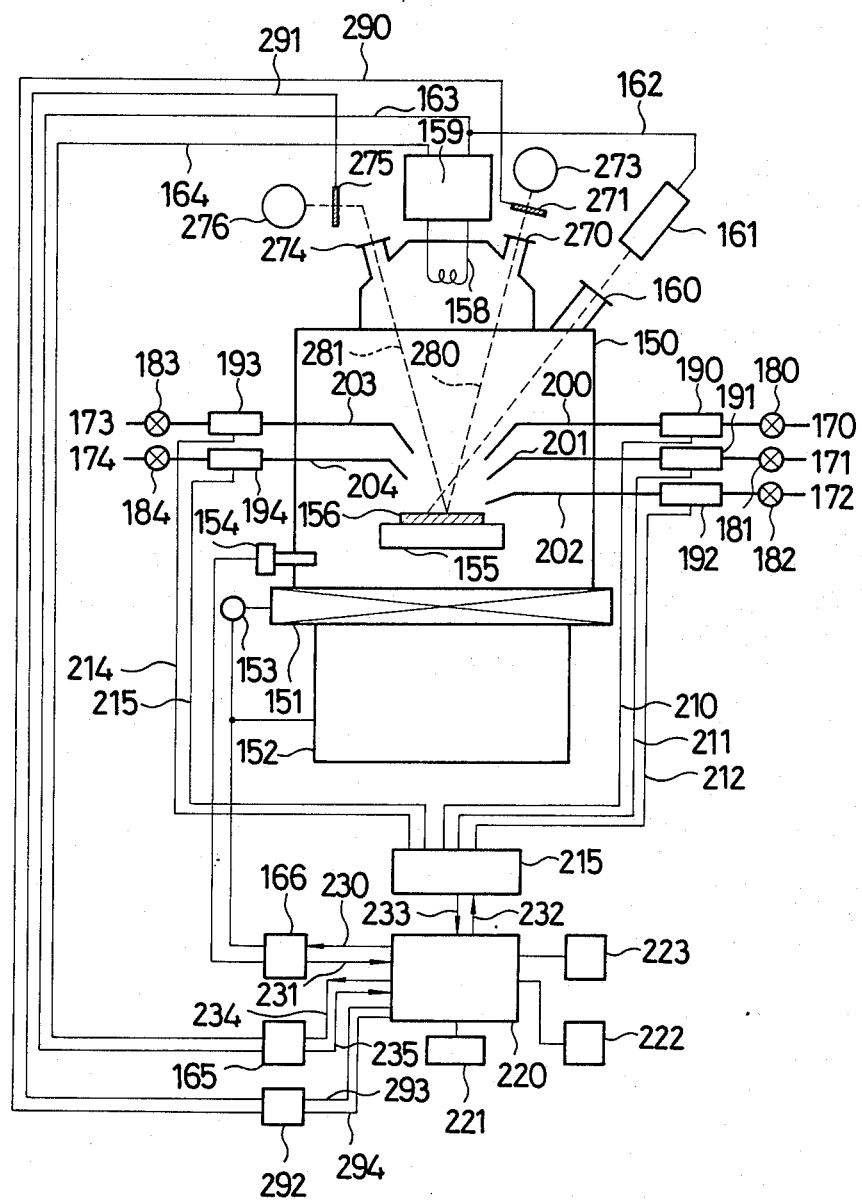
FIG. 13A is a schematic view showing the construction of another crystal growth device automatically carrying out the epitaxial growth processes accompanied with light irradiation.

Referring now to FIG. 13A, parts relating to the irradiation not shown in FIG. 12A will, in particular, be described. Ultraviolet rays 280 and 281 emitted from ultraviolet ray sources 273 and 276 such as mercury lamps, excimer lasers and argon ion lasers, respectively, are introduced via shutters 271 and 275, and windows 270 and 274, respectively, to a substrate 156. The shutters 271 and 275 are operated by controlling signals 293 and 294 through an interface circuit 292.

A manner of the irradiation with light 1 and light 2 which is accompanied with the crystal growth process shown in FIG. 12C is shown in FIG. 13B. The irradiation with light 1 is continued before the introduction of compound gas containing As is started and the irradiation with light 2 follows. The irradiation with light 2 is continued before the introduction of DMZn gas. Wave lengths of light 1 and light 2 may be selected so as to activate the surface reaction during the irradiation.

Such a case may also be possible that light 1 and light 2 have the same wave length but different intensities. Also, light having a range of wave lengths may be used for light 280 and 281, respectively. Further, two or more kinds of light having different wave lengths may be substituted for light 280 and 281, respectively, so as to irradiate the substrate with different kinds of light corresponding to the introduction or non-introduction periods of different kind of gases thereby more effective crystal growth may be carried out.

When a light source having a wide range of wave lengths such as a mercury lamp is used, the irradiation of semiconductor substrate with one light source but two kinds of light having two different range of wave lengths may be carried out by using a shutter with a filter.

While III-V mixed crystals have been referred to by way of example, the invention is of course also applicable to II-VI mixed crystal, compound semiconductors containing four elements or heter-junctions between III-V mixed crystals and II-VI mixed crystals merely by additionally installing more gas introduction units to the embodiments shown in FIGS. 12 and 13 as desired.

According to the present invention, the crystal growth of mixed crystals having ultrathin film structure with impurity doping, which has been difficult in the prior art, may be carried out in monolayer accuracy. In the prior art such as the MBE method, it is necessary to use a complex and expensive controlling device such as RHEED for controlling the thickness of growing crystalline thin layers in high accuracy. In contrast to the prior art, the process of the invention such as described above may be automated in a simple manner by an inexpensive controlling device for controlling the pressure of gases, the introduction of gases, the temperature of the substrate and the irradiation with light. Thus, the crystal growth method of the invention is suitable for the mass production of ultrathin film structures in high accuracy and effective in the industrial utilization.

Thus, according to the method of the invention, various devices such as hetero-junction devices, HEMT structure devices, superlattice structure devices, two or three terminal devices, negative resistance devices utilizing the transit time effect, tunnel injection devices, optical detector or light emitting devices, and semiconductor lasers may be manufactured.

What is claimed is:

1. A method of epitaxial growth for forming on a substrate crystal a single crystalline thin film of a compound semiconductor $A_xB_{1-x}C$ containing three component elements A, B and C, two elements A and B being elements of the same group, comprising the steps of successively introducing a plurality of gaseous compounds, each containing one of said three elements A, B and C, into the crystal growth vessel, evacuating the crystal growth chamber between the successive introductions of two gaseous compounds so as to avoid mixing of the gaseous compounds together, and repeating a sequence of the above steps.

2. A method according to claim 1, wherein each one of said three elements is a III group element or a V group element, respectively.

3. A method according to claim 1, wherein each one of said three elements is a II group element or a VI group element, respectively.

4. A method according to claim 1, wherein said three elements A, B and C are Al, Ga and As or Ga, Al and As, respectively, and a gaseous compound containing Al, a gaseous compound containing Ga and a gaseous compound containing As are sequentially introduced, in the order of A, B, and C, into the crystal growth vessel.

5. A method according to claim 1, wherein said three elements A, B and C are Al, Ga and As, respectively, and gaseous triethyl gallium is used as a gaseous compound containing Ga while gaseous triethyl aluminum or gaseous trisobutyl aluminum is used as a gaseous compound containing Al and the successively introducing step is carried out in the order Al, Ga and As.

6. A method of epitaxial growth for forming on a substrate crystal a single crystal of a compound semiconductor doped with an impurity element comprising the steps of successively introducing into a crystal growth vessel a gaseous compound $III_A$ containing a III group element as one of component elements of the compound semiconductor, a gaseous compound $III_B$ containing another III group element as another component element of the compound semiconductor, a gaseous compound $V_C$ containing a V group element as still another component element of the compound semiconductor and a doping gas containing the impurity element of the compound semiconductor in this order or in the order $V_C$, $III_A$, $III_B$ and the doping gas, and evacuating the chamber between the successive introductions of two gaseous compounds so as to avoid mixing together the gaseous compounds.

7. A method according to claim 6, wherein the two III group elements and the V group element are Ga, Al and As, respectively, and said impurity element contained in the doping gas is an element of II, IV, or VI group.

8. A method according to claim 7, wherein said doping gas is disilane ($Si_2H_6$), dimethyl zinc, dimethyl cadium, trimethyl gallium, selenium hydride ($H_2Se$), diethyl selenium or diethyl tellurium.

9. A method of epitaxial growth for forming on a substrate crystal of a single crystal of an impurity doped compound semiconductor containing two III group elements and a V group element as component elements, and a II group element, a IV group element and a VI group element as impurity elements, the method comprising the step of successively introducing a gaseous compound $III_A$ containing one of the two III group elements, a gaseous compound $III_B$ containing another one of the two III group elements, a gaseous compound $V_C$ containing the V group element, a gaseous compound $II_D$ containing the II group element, a gaseous compound $IV_E$ containing the IV group element and a gaseous compound $VI_F$ containing the VI group element into a crystal growth vessel in the order $II_D$, $III_A$, $III_B$, $IV_E$, $V_C$ and $VI_F$.

10. A method of epitaxial growth for forming a substrate crystal a single crystal of a quaternary alloy or a mixed crystalline compound semiconductor containing four component elements such as two III group elements and two V group elements, the method comprising the step of successively introducing into a crystal growth vessel in the following sequence, a gaseous compound $III_A$ containing one element of the two III group elements, a gaseous compound $III_B$ containing another element of the two group elements, a gaseous compound $V_C$ containing one element of the two V group elements, and a gaseous compound $v_D$ containing another element of the two V group elements .

11. A method according to claim 10, wherein said gaseous compound $III_A$, $III_B$, $V_C$ and $V_D$ is alkyl indium, alkyl gallium, arsine (AsH$_3$) and phosphine (PH$_3$), respectively.

12. A method according to any one of claims 1 to 11, wherein the substrate crystal is irradiated with ultraviolet rays during the crystal growth.

13. A method of epitaxial growth for forming on a substrate crystal a single crystal of a compound semiconductor containing three component elements, two elements thereof being elements of the same group but another one being an element of different group, the method comprising the steps of successively introducing into a crystal growth vessel three kinds of gaseous compounds respectively containing a different one of said three component elements, evacuating the vessel between the successive introductions of two gaseous compounds so as to avoid mixing together the gaseous compounds, and repeating the step of successively introducing to form a multilayer thin film structure comprising a mixed crystal of two different group elements and a mixed crystal of said three component elements.

14. A method according to claim 13, wherein both of said mixed crystal of two different group elements and said mixed crystal of three component elements are II-IV mixed crystals.

15. A method according to claim 13, wherein said two different group elements are Ga and As while said three component elements are Ga, Al and As.

16. A method according to claim 15, wherein triethyl aluminum or triisobutyl aluminum is used as one of said three kind of gaseous compound containing Al while triethyl gallium is used as another one of said three kind of gaseous compound containing Ga.

17. A method according to claim 16, wherein impurities such as disilane (Si$_2$H$_6$), trimethyl gallium, selenium hydride (H$_2$Se), diethyl selenium, diethyl tellurium, dimethyl cadmium and dimethyl zinc are used.

18. A method according to claim 1, wherein the step of sequentially introducing includes maintaining the pressure in the crystal growth vessel within $10^{-3}$ Torr and $10^{-6}$ Torr during each introduction of the gaseous compounds.

19. A method according to claim 1, wherein the step of sequentially introducing includes introducing gaseous alkyl aluminum at a maintained pressure of between $10^{-6}$ and $10^{-4}$ Torr, introducing gaseous alkyl gallium at a maintained pressure between $10^{-5}$ and $10^{-4}$ Torr, and introducing gaseous arsine at a maintained pressure of between $10^{-5}$ to $10^{-3}$ Torr.

20. A method according to claim 1, further comprising the steps of:
impurity doping after the introduction of element C during the step of successively introducing.

21. A method according to claim 20, wherein the step of impurity doping includes doping with impurities selected from the group consisting of disilane (Si$_2$H$_6$), trimethyl gallium, selenium hydride (H$_2$Se), dimethyl selenium, dimethyl tellurium, dimethyl cadmium and dimethyl zinc.

22. A method according to claim 1, wherein the step of sequentially introducing includes introducing the gaseous compounds in an order of one of A, B and C and A, C, B and C.

* * * * *

UNITED STATES PATENT AND TRADEMARK OFFICE
CERTIFICATE OF CORRECTION

PATENT NO. : 4,859,625

DATED : August 22, 1989

INVENTOR(S) : Matsumoto

It is certified that error appears in the above—identified patent and that said Letters Patent is hereby corrected as shown below:

On the title page, under item [19], "Matsumoto" should be

--Nishizawa et al.--.

Signed and Sealed this

Twenty-fifth Day of December, 1990

Attest:

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,859,625

DATED : August 22, 1989

INVENTOR(S) : Nishizawa et al.

It is certified that error appears in the above-identified patent and that said Letters Patent is hereby corrected as shown below:

On the title page, item [73], the assignment data should read
--[73] Assignee: Research Development Corporation of Japan, Sanyo Electric Industry Co., Ltd., Oki Electric Industry Co., Ltd., and Junichi Nishizawa, Japan--.

Signed and Sealed this

Thirtieth Day of April, 1991

*Attest:*

HARRY F. MANBECK, JR.

*Attesting Officer*  *Commissioner of Patents and Trademarks*